United States Patent [19]

Kuhara

[11] Patent Number: 5,894,231
[45] Date of Patent: Apr. 13, 1999

[54] HIGH SPEED BI-MOS LOGIC CIRCUIT OPERATIVE UNDER LOW POWER VOLTAGE

[75] Inventor: Shigeru Kuhara, Tokyo, Japan

[73] Assignee: NEC Corporation, Japan

[21] Appl. No.: 08/707,431

[22] Filed: Sep. 4, 1996

[30] Foreign Application Priority Data

Sep. 6, 1995 [JP] Japan ................................. 7-229318

[51] Int. Cl.[6] ............................................. H03K 19/08
[52] U.S. Cl. ............................ 326/110; 326/18; 326/108
[58] Field of Search .......................... 326/105–106, 326/108, 17–18, 109–110

[56] References Cited

U.S. PATENT DOCUMENTS

| | | | |
|---|---|---|---|
| 4,829,201 | 5/1989 | Masuda et al. | 326/18 |
| 4,858,189 | 8/1989 | Ogiue et al. | 326/18 |
| 5,119,314 | 6/1992 | Hotta et al. | 326/108 |

OTHER PUBLICATIONS

M. Minami, et al., "Base–Biased BiNMOS Circuit for Low Voltage Operation", The Institute of Electronics, Information and Communication Engineers, Technical Report of IEICE, ED93–37, ICD93–36, (1993–06), pp. 17–23. (Abstract in English).

*Primary Examiner*—Jon Santamauro
*Attorney, Agent, or Firm*—Ostrolenk, Faber, Gerb & Soffen, LLP

[57] ABSTRACT

First and second inverting stages and first and second decoding stages form in combination a decoder circuit, each of NAND gates of the first and second decoding stages and each of inverters of the first and second inverting stages are implemented by bi-MOS circuits, respectively, and the bi-MOS circuit for the NAND gate and the bi-MOS circuit for the inverter are a high-speed large-current consumption type and a low-speed small-current consumption type so that the decoder circuit achieves a high switching speed without sacrifice of power consumption.

7 Claims, 7 Drawing Sheets

HIGH SPEED BI-MOS LOGIC CIRCUIT OPERATIVE UNDER LOW POWER VOLTAGE

FIELD OF THE INVENTION

This invention relates to a logic circuit implemented by a combination of bipolar transistor and field effect transistors and, more particularly, to a high-speed logic circuit operable under a low power voltage.

DESCRIPTION OF THE RELATED ART

The logic circuit is a basic circuit component of various digital circuits such as a decoder circuit. FIG. 1 illustrates the concept of the decoder circuit. The decoder circuit is of the type having an n-bit input and an m-bit output. The n-bit input signal results in the m-bit output signal, and the m-bit output signals contains s selected bits and (m-s) non-selected bits. The selected bit positions and the number of s are variable. The s selected bits are changed to a high level or a low level; however, the (m-s) non-selected bits are unchanged. The m output bits are driven by m output logic gates, respectively. Alternating current is consumed during propagation of the input signal bit to the output logic gates associated with the s selected bits. On the other hand, the output logic gates associated with the (m-s) non-selected consumes direct current, and the amount of direct current accounts for a large proportion of the power consumption of the decoder.

FIG. 2 illustrates the circuit configuration of the prior art logic gate. The prior art logic gate is implemented by a combination of a bipolar transistor and field effect transistors, and largely comprises a complementary input inverter 1a and a driver circuit 1b. The circuit configuration of the combination of the bipolar transistor and the field effect transistors is hereinbelow referred to as "bi-MOS" circuit.

The prior art logic gate is coupled between a power voltage line VCC and a ground voltage line GND, and the driver circuit 1b includes an n-p-n type bipolar transistor QB1 and an n-channel enhancement type field effect transistor Qn1. The n-p-n type bipolar transistor QB1 and the n-channel enhancement type field effect transistor Qn1 are coupled in series between the power voltage line VCC and the ground voltage line GND. A p-channel enhancement type field effect transistor Qp1 and an n-channel enhancement type field effect transistor Qn2 form in combination the complementary inverter 1a, and are also coupled in series between the power voltage line VCC and the ground voltage line GND.

An input node 2a is connected to the gate electrodes of the field effect transistors Qp1, Qn1 and Qn2, and an input signal IN1 is supplied through the input node 2a to the gate electrodes of these field effect transistors Qp1, Qn1 and Qn2. An output node 2b is connected to the emitter node of the n-p-n type bipolar transistor QB1 and the drain node of the n-channel enhancement type field effect transistor Qn1, and an output signal OUT1 is produced at the output node 2b.

The complementary input inverter 1a complementarily changes the potential level at the common drain node N1 with respect to the input node 2a, and, accordingly, produces a complementary input signal CIN1. The input signal IN1 and the complementary input signal CIN1 are respectively supplied to the gate electrode of the n-channel enhancement type field effect transistor Qn1 and the base node of the n-p-n type bipolar transistor QB1. Then, the n-p-n type bipolar transistor QB1 and the n-channel enhancement type field effect transistor Qn1 complementarily turn on and off so as to change the potential level of the output signal OUT1.

The input signal IN1 is assumed to swing the potential level between the positive voltage level Vcc and the ground voltage level GND. The complementary input signal CIN1 also swings the potential level between the positive power voltage level Vcc and the ground voltage level GND. However, the potential level of the output signal OUT1 does not rise to the positive power voltage level Vcc. This is because of the fact that the potential level at the emitter node N2 is lower than the potential level at the base node N3 by an emitter-base forward bias voltage Vbe of the n-p-n type bipolar transistor QB1. The emitter-base forward bias voltage Vbe is of the order of 0.8 volt. Thus, the output signal OUT1 swings the potential within the narrow potential range between (Vcc-Vbe) and the ground voltage level.

When the prior art logic gate is expected to switch the output signal OUT1 with a low power voltage, the low power voltage deteriorates the noise margin and the switching speed.

In order to improve the small noise margin and the low switching speed, it is proposed to supply a higher potential level to the complementary input inverter 1a as shown in FIG. 3. The prior art logic circuit shown in FIG. 3 is similar in circuit configuration to the prior art logic circuit shown in FIG. 2, and, accordingly, the transistors are labeled with the same references as the transistors incorporated in the prior art logic gate shown in FIG. 2.

The prior art logic gate shown in FIG. 3 is different from the prior art logic gate shown in FIG. 2 in a positive power voltage level. The complementary input inverter 1a is coupled between a first positive power voltage line VP and the ground voltage line GND, and the driver circuit 1b is coupled between a second positive power voltage line VCC and the ground voltage line GND. The first positive power voltage line VP supplies a positive potential level Vp higher than the second positive power voltage Vcc.

If the potential difference between the first positive power voltage Vp and the second positive power voltage Vcc is close to the emitter-base forward bias Vbe, the output signal OUT1 swings the potential level within the relatively wide potential range almost between the second positive power voltage level Vcc and the ground voltage level, and the prior art logic gate shown in FIG. 3 improves the noise margin and the switching speed. However, there is a trade-off between the power consumption and the switching speed.

In detail, as depicted in FIG. 4 when the input signal IN1 is changed from the ground voltage level to the positive power voltage level Vcc, the n-channel enhancement type field effect transistor Qn2 turns on so as to pull down the potential level at the common drain node N1; however, the p-channel enhancement type field effect transistor does not turn off, because the potential level Vcc at the gate electrode is still lower than the potential level Vp at the source node. For this reason, through-current I1 flows from the first positive power voltage line VP through the p-channel enhancement type field effect transistor Qp1 and the n-channel enhancement type field effect transistor Qn2 to the ground voltage line GND. The through-current biases the base node of the n-p-n type bipolar transistor QB1 at all times, and the bias causes the n-p-n type bipolar transistor QB1 to turn between on-state and off-state at high speed. If a designer increases the threshold of the p-channel enhancement type field effect transistor Qp1, the positive power voltage level Vcc of the input signal IN1 does not cause the p-channel enhancement type field effect transistor Qp1 to turn off, and the through-current does not flow between the first positive power voltage line VP and the ground voltage line GND. However, when the p-channel enhancement type field effect transistor Qp1 turns on, the current from the first positive power voltage VP starts to bias the base node of the n-p-n type bipolar transistor QB1, and time delay takes place between the switching action of the p-channel enhancement type field effect transistor Qp1 and the switching action of the n-p-n type bipolar transistor QB1.

A NAND gate and a NOR gate of the bi-MOS implementation also encounters the trade-off.

SUMMARY OF THE INVENTION

It is therefore an important object of the present invention to provide a logic circuit which achieves a high-speed switching action without sacrifice of power consumption.

To accomplish the object, the present invention proposes to selectively use a first kind of logic gates switched at a high speed and consuming a large amount of current and a second kind of logic gates switched at a low speed and consuming a small amount of current.

In accordance with the present invention, there is provided a logic circuit comprising a plurality of logic gates forming a plurality of logic stages, the plurality of logic gates are broken down into a first kind of logic gates switched between a first logic level and a second logic level at a low speed and consuming a small amount of current during a generation of the second logic level and a second kind of logic gates switched between the first logic level and the second logic level at a high speed and consuming a large amount of current during a generation of the second logic level, and the plurality of logic stages are broken down into a first kind of logic stages generating first output signals of the first logic level greater than second output signals of the second logic level and implemented by the second kind of logic gates and a second kind of logic stages generating third output signals of the first logic level less than fourth output signals of the second logic level and implemented by the first kind of logic gates.

BRIEF DESCRIPTION OF THE DRAWINGS

The features and advantages the logic circuit according to the present invention will be more clearly understood from the following description taken in conjunction with the accompanying drawings in which.

DESCRIPTION OF THE PREFERRED EMBODIMENT

Figure 5:
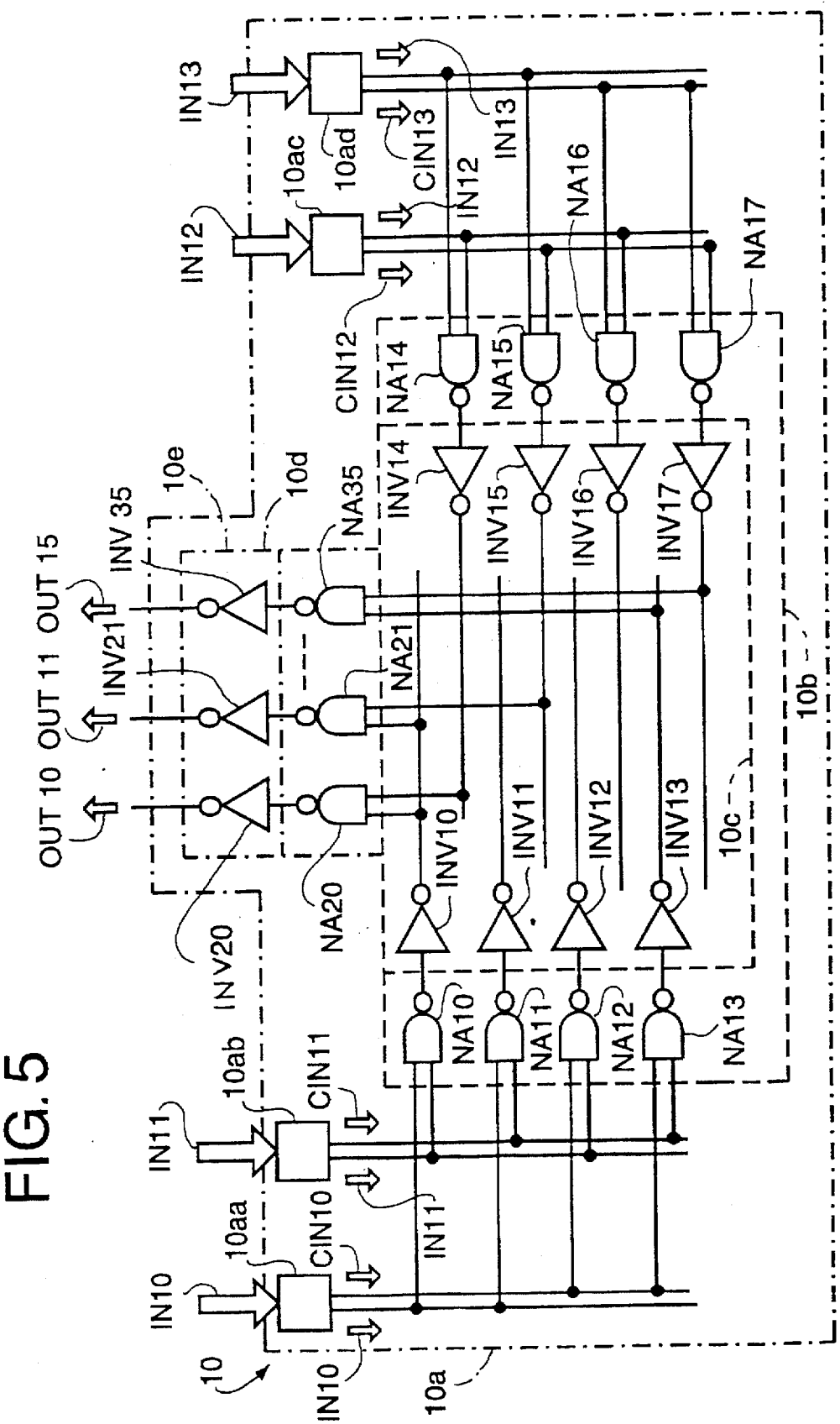
FIG. 5 is a circuit diagram showing the arrangement of a decoder circuit according to the present invention.

Referring first to FIG. 5 of the drawings, a decoder 10 embodying the present invention largely comprises a pre-decoding stage 10a, a first decoding stage 10b, a first inverting stage 10c, a second decoding stage 10d and a second inverting stage 10e. As will be understood from the following description, the first and second decoding stages 10b and 10d are classified into a first kind of logic gates, and the first and second inverting stages 10c and 10e are a second kind of logic stages. Therefore, the first decoding stage 10b to the second inverting stage 10e serve as a plurality of logic stages. In the following description, a first logic level and a second logic level are assumed to be a high level and a low level, respectively.

The predecoding stage 10a includes a plurality of predecoding circuits 10aa, 10ab, 10ac and 10ad. Input signals IN10 to IN13 are supplied to the predecoding circuits 10aa to 10ad, and the predecoding circuits 10aa to 10ad yield complementary input signals CIN10, CIN11, CIN12 and CIN13. The input signals IN10–IN13 and the complementary input signals CIN10 to CIN13 form eight combinations, and are supplied from the predecoding stage 10a to the first decoding stage 10b.

The first decoding stage 10b includes eight two-input NAND gates NA10, NA11, NA12, NA13, NA14, NA15, NA16 and NA17, and the input signals IN10–IN13 and the complementary input signals CIN10–CIN13 are selectively supplied to these two-input NAND gates NA10 to NA17. In this instance, the input signals IN10/IN11 and the complementary input signals CIN10/CIN11 are selectively transferred to the NAND gates NA10–NA13, and the other input signals IN12/IN13 and the complementary input signals CIN12/CIN13 are distributed to the NAND gates NA14 to NA17. For this reason, one of the NAND gates NA10–NA13 and the others generates the low level and the high level, respectively, and one of the NAND gates NA14–NA17 and the others yield the low level and the high level, respectively. If the input signals IN10–IN13 are the high level, the NAND gates NA10 and NA14 generate the output signals of the low level, and the other NAND gates NA11–NA13 and NA15–NA17 generate the output signals of the high level. In this situation, the output signals of the NAND gates NA11–NA13 and NA15–NA17 are first output signals, and the output signals of the NAND gates NA10 and NA14 are second output signals less than the first output signals. Thus, the first decoding stage 10b selects two combinations from the eight combinations.

The first inverting stage 10c includes eight inverters INV10, INV11, INV12, INV13, INV14, INV15, INV16 and INV17, and the output nodes of the NAND gates NA10–NA17 are respectively connected to the input nodes of the inverters INV10–INV17. In the above described situation, the inverters INV10 and INV14 produce the output signals of the high level, and the other inverters INV11–INV13 and INV15–INV17 produce the output signals of the low level. For this reason, the output signals of the inverters INV10 and INV14 are third output signals, and the output signals of the other inverters INV11–INV13 and INV15–INV17 are fourth output signals greater than the third output signals.

The second decoding stage 10d includes sixteen two-input VOLTAGE NAND gates NA20, NA21, . . . and NA35. The eight output signals of the inverters INV10–INV17 form sixteen combinations, and the sixteen combinations are respectively supplied to the sixteen two-input NAND gates NA20 to NA35. In the above described situation, only the inverters INV10 and INV14 yield the output signals of the high level, and these output signals of the high level are supplied to the NAND gate NA20. Only the NAND gate NA20 generates the output signal of the low level, and the other NAND gates NA21 to NA35 produce the output signals of the high level. The output signals of the NAND gates NA21–NA35 are the first output signals greater than the second output signal of the NAND gate NA20.

The second inverting stage 10e includes sixteen VOLT-AGE inverters INV20, INV21, . . . and INV35, and the output nodes of the NAND gates NA20–NA35 are respectively connected to the inverters INV20–INV35. In the above described situation, only the inverter INV20 produces the output signal of the high level, and the other inverters INV21–INV35 generate the output signals of the low level. The output signal of the inverter INV20 is the third output signal less than the four th output signals of the other inverters INV21 to INV35. Sixteen output s ignals OUT10–OUT15 are supplied from the second inverting stage 10e, and only one output signal is the high level.

Subsequently, description is made on the circuit configuration of the inverters INV10–INV17 and INV20–INV35 and the circuit configuration of the NAND gates NA10–NA17 and NA20–NA35. The circuit configurations shown in FIGS. 6A and 6B are candidates for the inverters INV10–INV17 and INV20–INV35.

Figure 1:
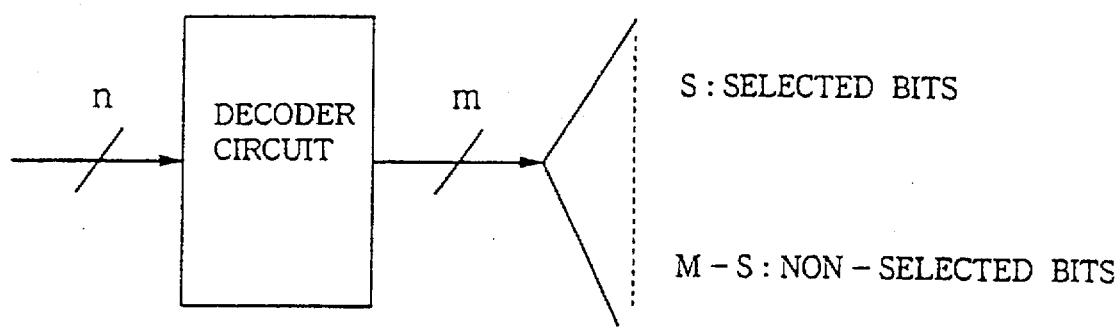
FIG. 1 is a block diagram showing the basic concept of the decoder circuit.
Figure 4:
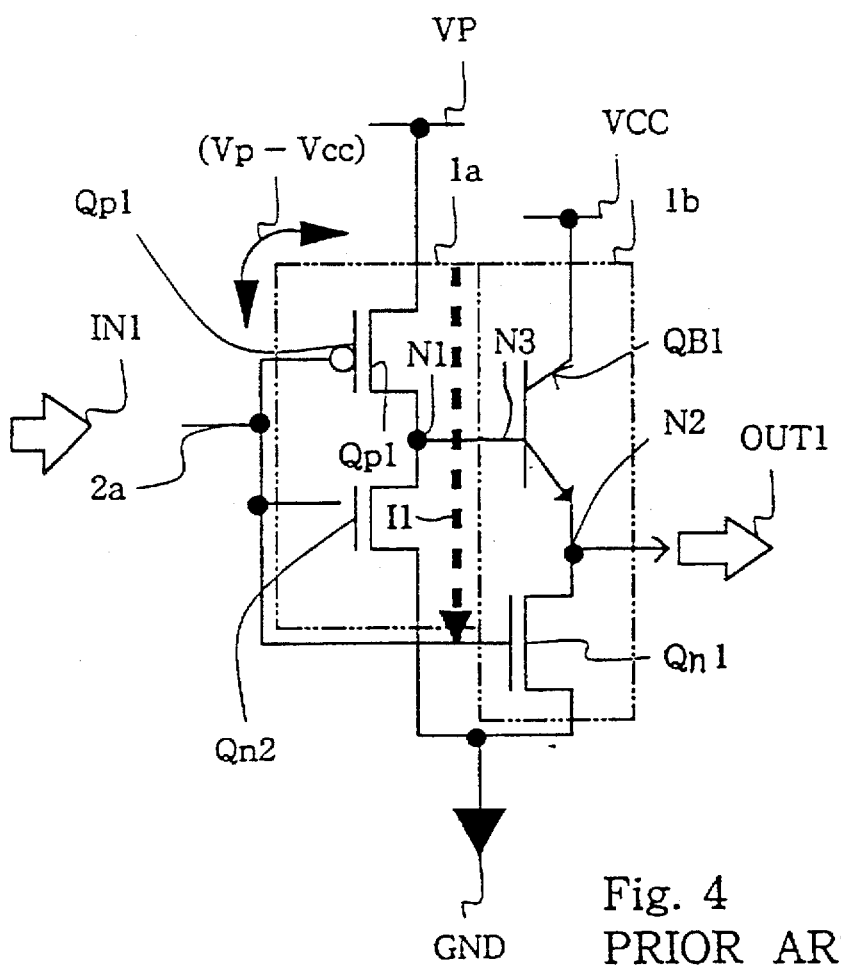
FIG. 4 is a circuit diagram showing the through-current inherent in the second prior art logic gate.
Figure 2:
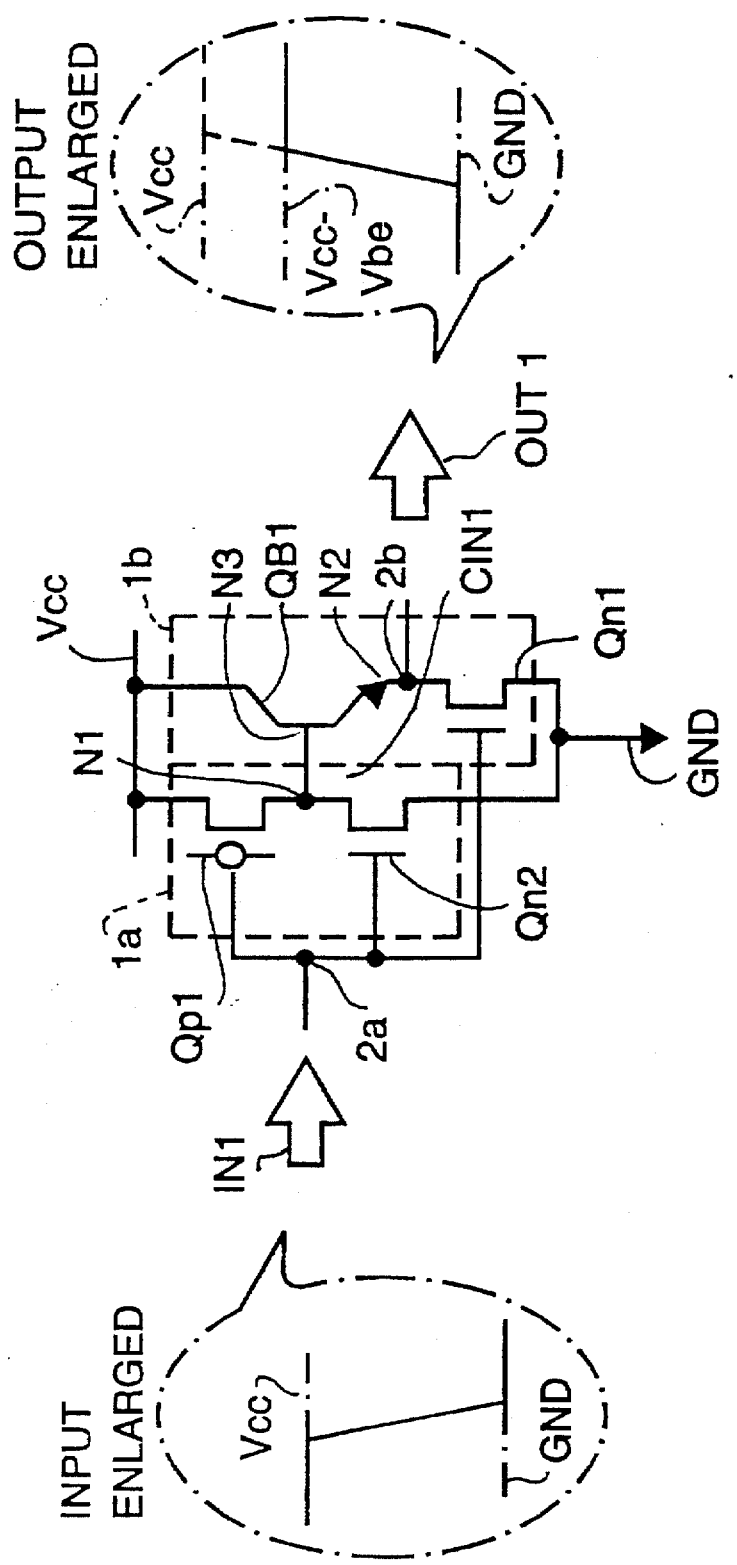
FIG. 2 is a circuit diagram showing the circuit configuration of the first prior art logic gate.
Figure 3:
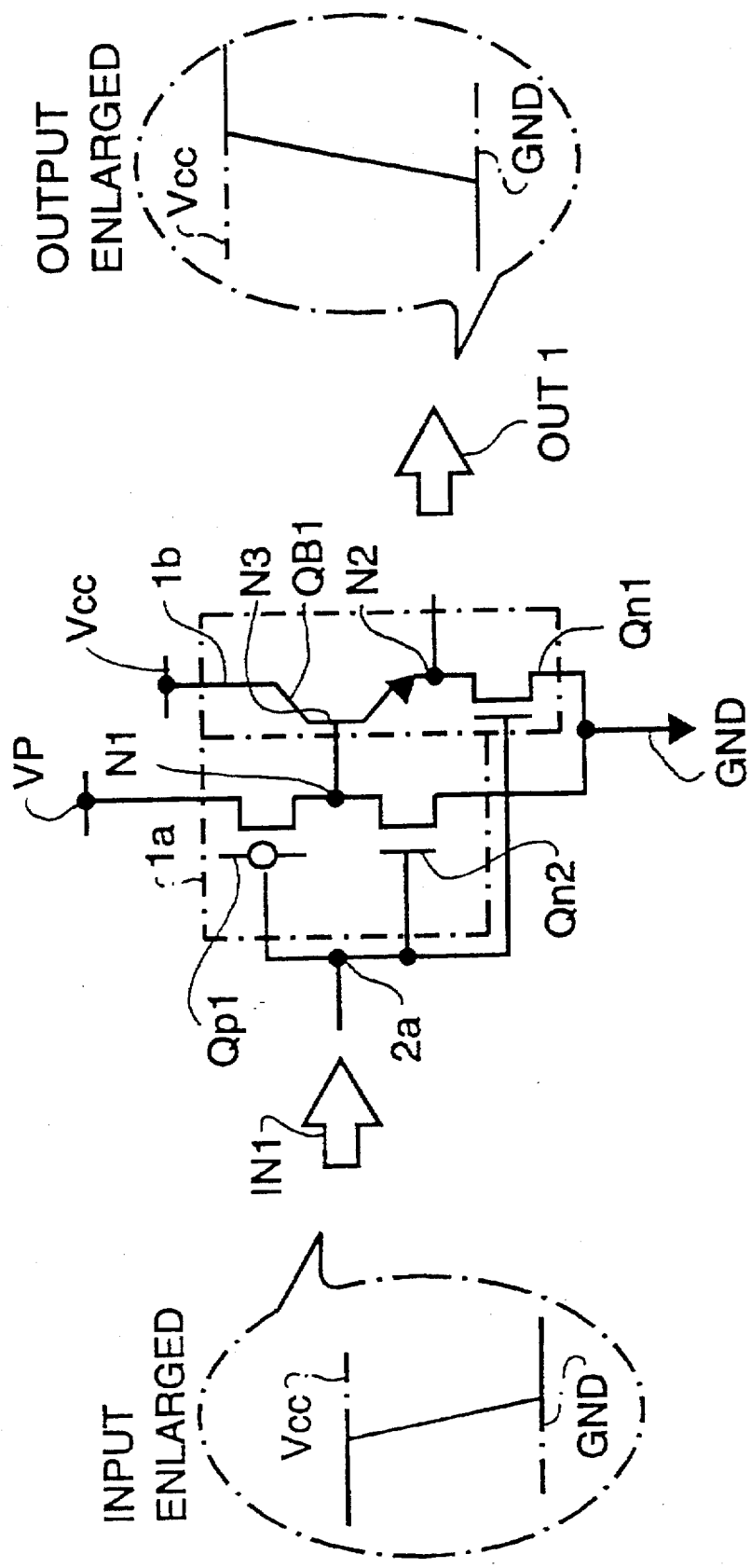
FIG. 3 is a circuit diagram showing the circuit configuration of the second prior art logic gate which improves the problem inherent in the first prior art logic gate.
Figure 6A:
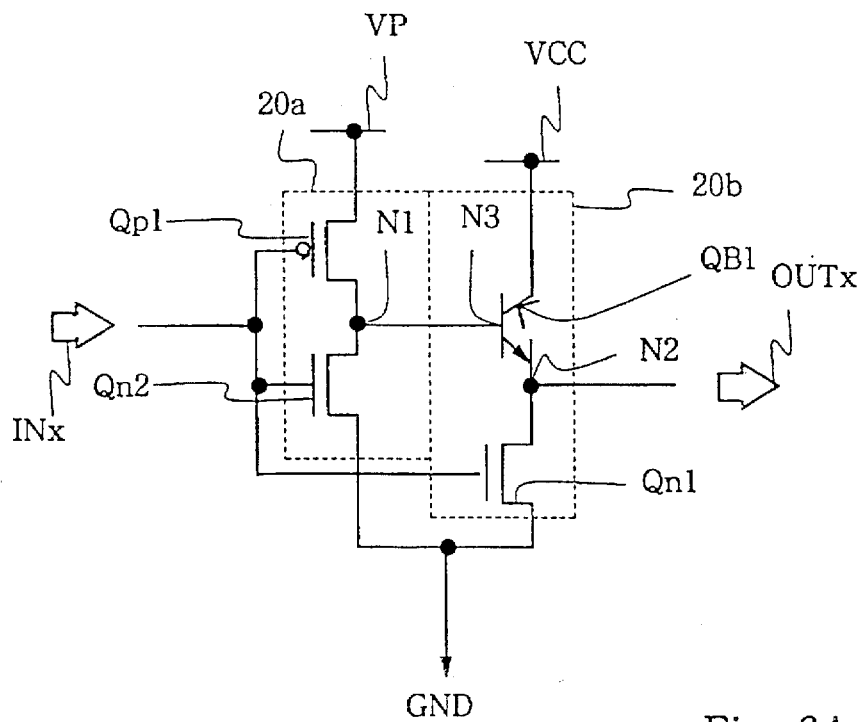
FIGS. 6A and 6B are circuit diagrams showing circuit configurations of an inverter available for the decoder.

The first candidate is shown in FIG. 6A, and is similar in circuit configuration to the prior art inverter shown in FIG. 3. The first candidate largely comprises a complementary inverter 20a and an output driver 20b;

however, component transistors of the first candidate are labeled with the same references as those of the prior art inverter without detailed description for avoiding undesirable repetition. The input signal INx is assumed to swing the potential level between the positive power voltage Vcc and the ground level, and the p-channel enhancement type field effect transistor Qp1 has a threshold smaller than the potential difference (Vp–Vcc). For this reason, even if the input signal INx rises to the positive power voltage line Vcc, the p-channel enhancement type field effect transistor Qp1 does not completely turn off, and current flows through the p-channel enhancement type field effect transistor Qp1 and the n-channel enhancement type field effect transistor Qn2. However, the current biases the base node of the n-p-n type bipolar transistor QB1 at all times, and the n-p-n type bipolar transistor QB1 is switched at high speed. Thus, the first candidate achieves a high switching speed; however, the current consumption is large due to the through-current while the first candidate is generating the output signal OUTx of the low level.

Figure 6B:
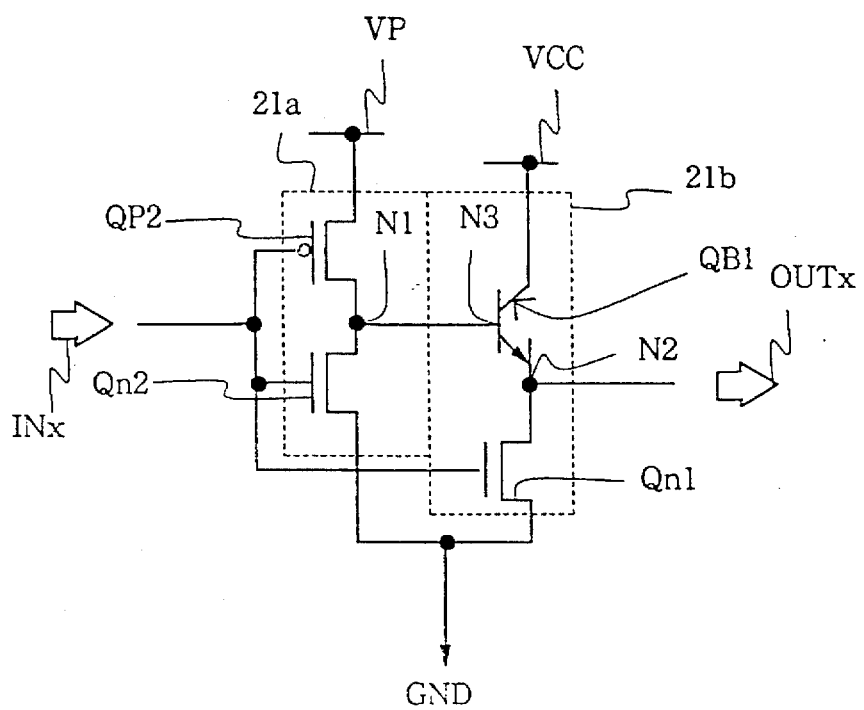

The second candidate is shown in FIG. 6B, and also largely comprises a complementary inverter 21a and an output driver 21b. The second candidate is different from the first candidate in the threshold of a p-channel enhancement type field effect transistor Qp2. The other transistors are similar to those of the first candidate, and are labeled with the same references as those of the first candidate. The threshold of the p-channel enhancement type field effect transistor Qp2 is equal to or greater than the potential difference (Vp–Vcc). When the input signal INx rises to the positive power voltage Vcc, the p-channel enhancement type field effect transistor Qp2 completely turns off, and no through-current flows. For this reason, the current consumption is much smaller than the first candidate while the second candidate is generating the output signal OUTx of the low level. However, when the input signal INx is decayed to the ground level, the current is supplied through the p-channel enhancement type field effect transistor Qp2 to the base node of the n-p-n type bipolar transistor QB1, and biases the base node. For this reason, the second candidate is slower in switching action than the first candidate.

The second candidate serves as each of the inverters INV10–INV17 of the first inverting stage 10c, because the second candidate prevents most of the inverters INV10–INV17 from the through-current. Similarly, the second candidate forms the second inverting stage 10e, and the inverters INV20 to INV35 are free from through-current during the generation of the low level. As a result, reduction of current consumption is wide.

Two candidates are also prepared for the NAND gates NA10–NA17 and NA20–NA35. The first candidate is shown in FIG. 7A, and the second candidate is shown in FIG. 7B.

Figure 7A:
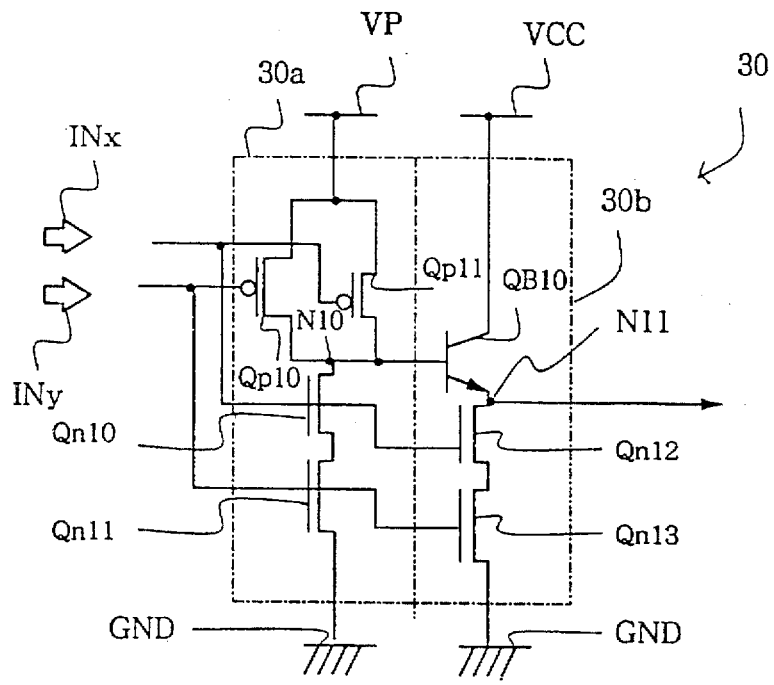
FIGS. 7A and 7B are circuit diagrams showing circuit configurations of a NAND gate used in the decoder.
Figure 7B:
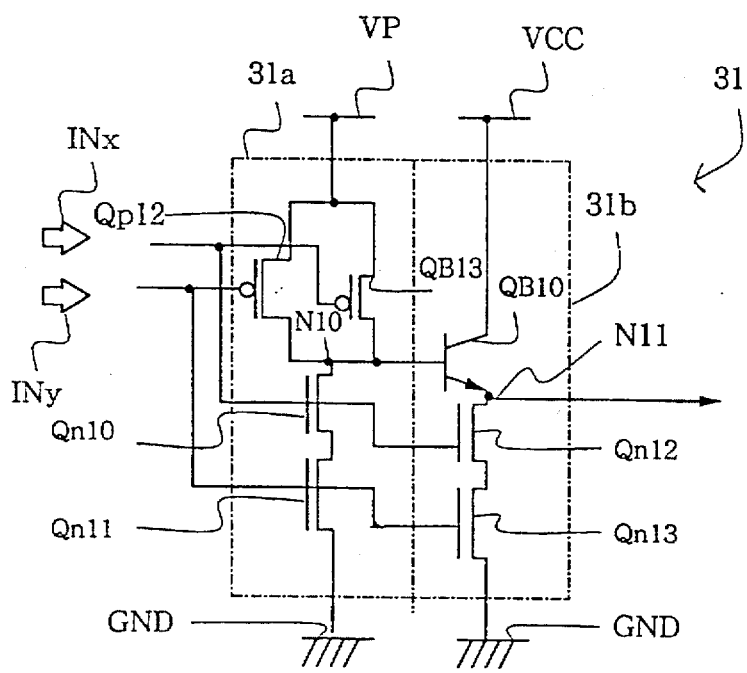

The first candidate is designated by reference numeral 30 in FIG. 7A, and largely comprises a logic stage 30a and an output driver 30b. The logic stage 30a includes two p-channel enhancement type field effect transistors Qp10 and Qp11 coupled in parallel to the first positive power voltage line VP and two n-channel enhancement type field effect transistors Qn10 and Qn11 coupled in series between the common drain node N10 of the p-channel enhancement type field effect transistors Qp10/Qp11 and the ground line GND. Two input signals INx and INy are supplied to the first candidate, and swing the voltage level between a second positive power voltage level Vcc and the ground voltage level. The second positive power voltage Vcc is lower than the first positive power voltage level Vp on the power supply line VP.

The input signal INx is supplied to the gate electrode of the p-channel enhancement type field effect transistor Qp11 and the gate electrode of the n-channel enhancement type field effect transistor Qn10. On the other hand, the other input signal INy is supplied to the gate electrode of the p-channel enhancement type field effect transistor Qp10 and the gate electrode of the n-channel enhancement type field effect transistor Qn11. Therefore, only when both input signals INx and INy are in the high level, the low level takes place at the common drain node N10. However, if at least one input signal INx or INy is in the low level, one of or both of the p-channel enhancement type field effect transistors Qp10/Qp11 supplies the high level to the common drain node N10.

The threshold of the p-channel enhancement type field effect transistors Qp10/Qp11 is so small that the p-channel enhancement type field effect transistors Qp10 and Qp11 do not completely turn off in the presence of the second voltage level Vcc at the gate electrodes thereof. For this reason, even when both input signals INx and INy are in the low level, through-current flows into the ground line GND.

The output driver 30b includes a series of an n-p-n type bipolar transistor QB10 and n-channel enhancement type field effect transistors Qn12 and Qn13 coupled between the second positive power voltage line VCC and the ground line GND. The common drain node N10 is connected to the base node of the n-p-n type bipolar transistor QB10, and the input signals INx and INy are supplied to the gate electrode of the n-channel enhancement type field effect transistor Qn12 and the gate electrode of the n-channel enhancement type field effect transistor Qn13, respectively.

If both input signals INx and INy are in the high level, the low level at the common drain node N10 causes the n-p-n type bipolar transistor QB10 to turn off, and the ground level is supplied through the n-channel enhancement type field effect transistors Qn12 and Qn13 to an output node N11. In this situation, the n-p-n type bipolar transistor QBIO is turned off; however, the current flowing into the common drain node N10 biases the base node of the n-p-n type bipolar transistor QB10.

On the other hand, if at least one of the input signals INx and INy is in the low level, the high level at the common drain node N10 allows the n-p-n type bipolar transistor QB10 to turn on, and at least one of the n-channel enhancement type field effect transistors Qn12 and Qn13 isolates the output node N11 from the ground line GND. The current has already biased the base node of the n-p-n type bipolar transistor QB10, and the n-p-n type bipolar transistor QB10 turns on at high speed. The output node N11 is changed to the high level.

The second candidate 31, depicted in FIG. 7B, also comprises a logic stage 31a and an output driver 31b. The output driver 31b is identical with the output driver 30b, and no further description is incorporated hereinbelow for the sake of simplicity. The logic stage 31a is similar in circuit configuration to the logic stage 30a; however, the p-channel enhancement type field effect transistors Qp10 and Qp11 are replaced with p-channel enhancement type field effect transistors Qp12 and Qp13. The p-channel enhancement type field effect transistors Qp12 and Qp13 have a threshold large enough to allow the transistors Qp12 and Qp13 to completely turn off in the presence of the input signals INx and INy at the second positive power voltage level Vcc. When both of the input signals INx/INy are changed to the second positive power voltage Vcc, the p-channel enhancement type field effect transistors Qp12 and Qp13 completely turn off, and no through-current flows into the ground line GND. For this reason, the current consumption of the second candidate 31 is smaller than the first candidate. However, the second candidate 31 is switched slower than the first candidate.

Most of the NAND gates NA10–NA17 produce the output signals of the high level, and only two NAND gates of the first decoding stage 10b supply the output signals of the low level to the first inverting stage 10c. For this reason, even if the second candidate is employed for the first decoding stage, the reduction of current is limited. For this reason, the first decoding stage 10b is implemented by the first candidate, and the NAND gates NA10–NA17 are responsive to the input signals IN10–IN13 and the complementary input signals CIN10–CIN13 at high speed.

The first candidate is also employed for the second decoding stage, because only one NAND gate produces the output signal of the low level. The NAND gates NA20 to NA35 are switched at high speed.

As will be appreciated from the foregoing description, the two kinds of logic gates achieve a high speed operation without sacrifice of the current consumption.

Although the particular embodiment of the present invention has been shown and described, it will be obvious to those skilled in the art that various changes and modifications may be made without departing from the spirit and scope of the present invention.

Figure 8A:
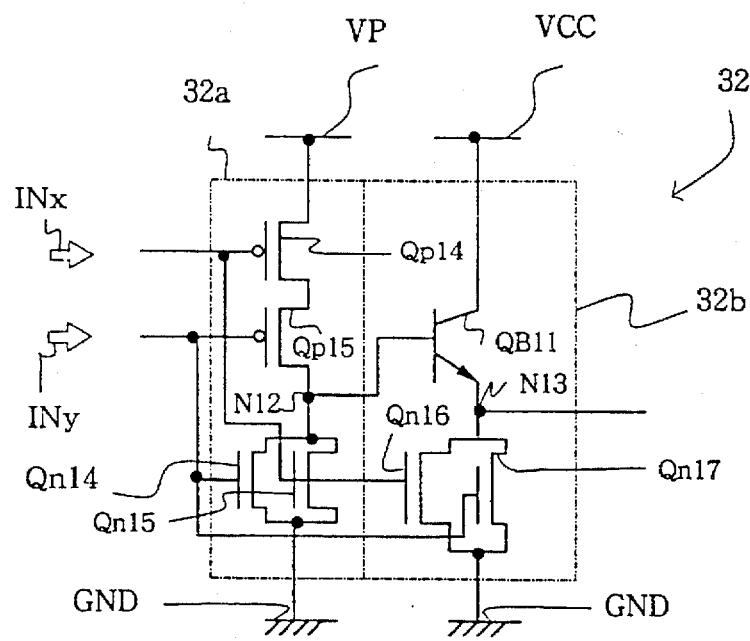
FIGS. 8A and 8B are circuit diagrams showing the two kinds of NOR gate available for a logic circuit according to the present invention.
Figure 8B:
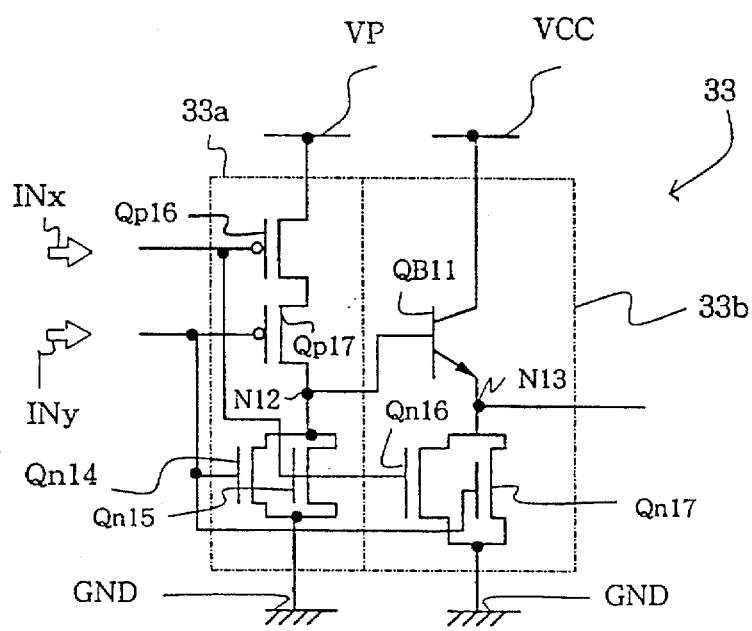

For example, two kinds of NOR gate are selectively available for a logic circuit according to the present invention. The first kind of logic gate is shown in FIG. 8A, and achieves a high switching speed. On the other hand, FIG. 8B shows the second kind of logic gate, and is suitable for reduction in current consumption.

In detail, the NOR gate shown in FIG. 8A largely comprises a logic stage 32a and an output driver 32b. The logic stage 32a includes two p-channel enhancement type field effect transistors Qp14 and Qp15 coupled in series between the first positive power voltage line VP and a drain node N12 and two n-channel enhancement type field effect transistors Qn14 and Qn15 coupled in parallel between the drain node N12 of the p-channel enhancement type field effect transistor Qp15 and the ground line GND. Two input signals INx and INy are supplied to the NOR gate, and swing the voltage level between a second positive power voltage level Vcc and the ground voltage level. The second positive power voltage Vcc is lower than the first positive power voltage level Vp on the power supply line VP.

The input signal INx is supplied to the gate electrode of the p-channel enhancement type field effect transistor Qp14 and the gate electrode of the n-channel enhancement type field effect transistor Qn15. On the other hand, the other input signal INy is supplied to the gate electrode of the p-channel enhancement type field effect transistor Qp15 and the gate electrode of the n-channel enhancement type field effect transistor Qn14. Therefore, only when both input signals INx and INy are in the low level, the high level takes place at the drain node N120. However, if at least one input signal INx or INy is in the high level, one of the p-channel enhancement type field effect transistors Qp14/Qp15 isolates the drain node N12 from the first positive power voltage line VP, and one of or both of the n-channel enhancement type field effect transistors Qn14/Qn15 supply the low level to the drain node N12.

The threshold of the p-channel enhancement type field effect transistors Qp14/Qp15 is so small that the p-channel enhancement type field effect transistors Qp14 and Qp15 do not completely turn off in the presence of the second voltage level Vcc at the gate electrodes thereof. For this reason, even when both input signals INx and INy are in the high level, through-current flows into the ground line GND.

The output driver 33b includes an n-p-n type bipolar transistor QB11 coupled between the second power supply line VCC and an output node N13 and n-channel enhancement type field effect transistors Qn16 and Qn17 coupled in parallel between the output node N13 and the ground line GND. The drain node N12 is connected to the base node of the n-p-n type bipolar transistor QB11, and the input signals INx and INy are supplied to the gate electrode of the n-channel enhancement type field effect transistor Qn16 and the gate electrode of the n-channel enhancement type field effect transistor Qn17, respectively.

If both input signals INx and INy are in the low level, the high level at the drain node N12 causes the n-p-n type bipolar transistor QB11 to turn off, and the second positive power voltage level Vcc is supplied through the n-p-n type bipolar transistor QB11. The n-channel enhancement type field effect transistors Qn16 and Qn17 isolate the output node N13 from the ground line GND.

On the other hand, if at least one of the input signals INx and INy is in the high level, the low level at the drain node N12 causes the n-p-n type bipolar transistor QB11 to turn off, and at least one of the n-channel enhancement type field effect transistors Qn16 and Qn17 supply the ground voltage level to the output node N13. In this situation, the n-p-n type bipolar transistor QB11 is turned off; however, the current flowing into the drain node N12 biases the base node of the n-p-n type bipolar transistor QB11, and allows the n-p-n type bipolar transistor QB11 to turn on at high speed upon a change of both input signals INx/INy to the low level.

FIG. 8B shows the second kind of NOR gate 33, and the NOR gate 33 also comprises a logic stage 33a and an output driver 33b. The output driver 33b is identical with the output driver 32, and no further description is incorporated hereinbelow for the sake of simplicity. The logic stage 33a is similar in circuit configuration to the logic stage 32a; however, the p-channel enhancement type field effect transistors Qp14 and Qp15 are replaced with p-channel enhancement type field effect transistors Qp16 and Qp17. The p-channel enhancement type field effect transistors Qp16 and Qp17 have a threshold large enough to allow the transistors Qp16 and Qp17 to completely turn off in the presence of the input signals INx and INy at the second positive power voltage level Vcc. When at least one of the input signals INx/INy is changed to the second positive power voltage Vcc, the p-channel enhancement type field effect transistors Qp16 or Qp17 completely turns off, and no through-current flows into the ground line GND. For this reason, the current consumption of the NOR gate 33 is smaller than the NOR gate 32. However, the NOR gate 33 is switched slower than the NOR gate 32.

The decoder circuit is formed by selectively using the two kinds of NOR gate and the inverter.

Moreover, a decoder according to the present invention may have only one decoding stage or more than two decoding stages, and the predecoder section 10a may not be incorporated in a decoder according to the present invention.

What is claimed is:

1. A logic circuit comprising:
   a first plurality of logic gates switched between a first logic level and a second logic level at a low speed and consuming a small amount of current during a generation of said second logic level;
   a second plurality of logic gates switched between said first logic level and said second logic level at a high speed and consuming a large amount of current during a generation of said second logic level;
   a first logic stage generating first output signals, said first logic stare implemented by at least two of said second plurality of logic gates;
   a second logic stage coupled to said first logic stage and generating second output signals in response to the first output signals generating by the first logic stage, said second logic stage implemented by at least two of said first plurality of logic gates;
   a third logic stage coupled to the second logic stage and generating third output signals in response to the second output signals generated by the second logic stage, said third logic stage implemented by at least two other of said second plurality of logic gates; and
   a fourth logic stage coupled to the third logic stage and generating fourth output signals in response to the third output signals generated by the third logic stage, said fourth logic stage implemented by at least two other of said first plurality of logic gates.

2. The logic circuit as set forth in claim 1, in which said logic circuit serves as a decoder.

3. The logic circuit as set forth in claim 2, in which said first logic stage is a first decoding stage, said second logic stage is a first inverting stage, said third logic stage is a second decoding stage and said fourth logic stage is a second inverting stage.

4. The logic circuit as set forth in claim 3, in which each of said first decoding stage, said second decoding stage, said first inverting stage and said second inverting stage are implemented by a combination of bipolar transistors and field effect transistors.

5. The logic circuit as set forth in claim 3, in which a first array of NAND gates, a second array of NAND gates, a third array of inverters and a fourth array of inverters form said first decoding stage, said second decoding stage, said first inverting stage and said second inverting stage, respectively.

6. The logic circuit as set forth in claim 5, further comprising a predecoding stage for producing complementary input signals from input signals, and said input signals and said complementary input signals are selectively supplied to the NAND gates of said first array.

7. The logic circuit as set forth in claim 5, in which each of the inverters of said third and fourth arrays includes a series combination of a first enhancement type field effect transistor of a first channel conductivity type, a first common drain node and a second enhancement type field effect transistor of a second channel conductivity type coupled between a first source of voltage and a second source of voltage different in potential level from said first source of voltage, a series combination of a first bipolar transistor having a base node coupled to said first common drain node, a first output node and a third enhancement type field effect transistor of said second conductivity type coupled between said second source of voltage and a third source of voltage for producing a potential level between a potential level of said first source of voltage and a potential level of said second source of voltage and an input node coupled to the gate electrode of said first to third enhancement type field effect transistors, and each of the NAND gates of said first and second arrays includes a parallel combination of a fourth enhancement type field effect transistor of said first channel conductivity type and a fifth enhancement type field effect transistor of said first channel conductivity type coupled between said first source of voltage and a second common drain node, a series combination of a sixth enhancement type field effect transistor of said second channel conductivity type and a seventh enhancement type field effect transistor of said second channel conductivity type coupled between said second common drain node and said second source of voltage, a series combination of a second bipolar transistor having a base node coupled to said second common drain node, a second output node, an eighth enhancement type field effect transistor of said second channel conductivity type and a ninth enhancement type field effect transistor of said second conductivity type coupled between said third source of voltage and said second source of voltage, a first input node coupled to the gate electrode of said fifth enhancement type field effect transistor, the gate electrode of said sixth enhancement type field effect transistor and the gate electrode of said eighth enhancement type field effect transistor, and a second input node coupled to the gate electrode of said fourth enhancement type field effect transistor, the gate electrode of said seventh enhancement type field effect transistor and the gate electrode of said ninth enhancement type field effect transistor.

* * * * *